United States Patent
Chang et al.

(10) Patent No.: US 9,159,687 B2
(45) Date of Patent: Oct. 13, 2015

(54) SOLDER BUMP FOR BALL GRID ARRAY

(75) Inventors: Jung-Hua Chang, Hsin-Chu (TW);
Cheng-Lin Huang, Hsin-Chu (TW);
Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 10 days.

(21) Appl. No.: 13/572,302

(22) Filed: Aug. 10, 2012

(65) Prior Publication Data

US 2014/0035135 A1    Feb. 6, 2014

Related U.S. Application Data

(60) Provisional application No. 61/677,891, filed on Jul. 31, 2012.

(51) Int. Cl.
*H01L 23/495* (2006.01)
*H01L 23/00* (2006.01)
*H01L 23/498* (2006.01)

(52) U.S. Cl.
CPC .......... *H01L 24/13* (2013.01); *H01L 23/49816* (2013.01); *H01L 24/11* (2013.01); *H01L 2224/118* (2013.01); *H01L 2224/13* (2013.01); *H01L 2224/131* (2013.01); *H01L 2224/13016* (2013.01); *H01L 2224/1319* (2013.01); *H01L 2924/014* (2013.01); *H01L 2924/01029* (2013.01); *H01L 2924/06* (2013.01); *H01L 2924/0665* (2013.01); *H01L 2924/37001* (2013.01)

USPC ............ 257/676; 257/E21.506; 257/E21.509; 257/E23.031; 438/613

(58) Field of Classification Search
CPC ..... H01L 23/498; H01L 23/495; H01L 24/13; H01L 24/11
USPC ........... 257/676, E23.031, E21.506, E21.509; 438/613
See application file for complete search history.

(56) References Cited

U.S. PATENT DOCUMENTS

| | | | |
|---|---|---|---|
| 7,208,842 B2 * | 4/2007 | Jeong .............................. | 257/781 |
| 8,035,226 B1 | 10/2011 | Wilcoxen et al. | |
| 2006/0220244 A1 | 10/2006 | Lu et al. | |
| 2009/0310320 A1 | 12/2009 | Roth et al. | |
| 2012/0086124 A1 | 4/2012 | Yamaguchi | |
| 2012/0126397 A1 * | 5/2012 | Chien et al. .................... | 257/737 |
| 2012/0193783 A1 * | 8/2012 | Hong et al. .................... | 257/737 |
| 2012/0224331 A1 * | 9/2012 | Roth et al. ..................... | 361/728 |
| 2013/0043573 A1 * | 2/2013 | Williams et al. ............... | 257/676 |

FOREIGN PATENT DOCUMENTS

| | | |
|---|---|---|
| JP | 2006261641 | 9/2006 |
| JP | 2012080043 | 4/2012 |
| KR | 1020050019664 | 3/2005 |

* cited by examiner

*Primary Examiner* — Matthew W Such
*Assistant Examiner* — Krista Soderholm
(74) *Attorney, Agent, or Firm* — Slater and Matsil, L.L.P.

(57) ABSTRACT

A solder bump structure for a ball grid array (BGA) includes at least one under bump metal (UBM) layer and a solder bump formed over the at least one UBM layer. The solder bump has a bump width and a bump height and the ratio of the bump height over the bump width is less than 1.

20 Claims, 4 Drawing Sheets

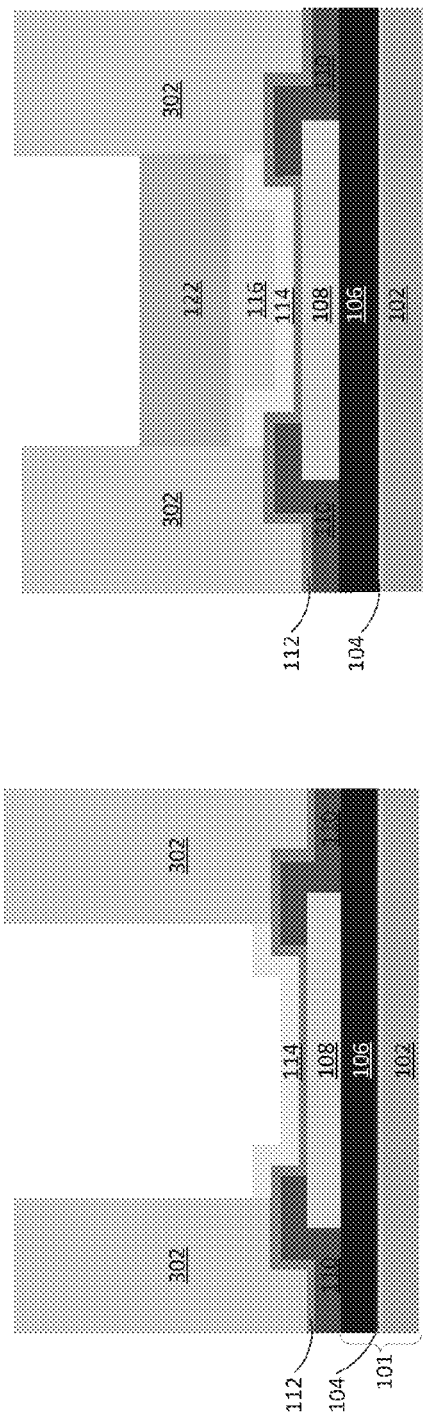
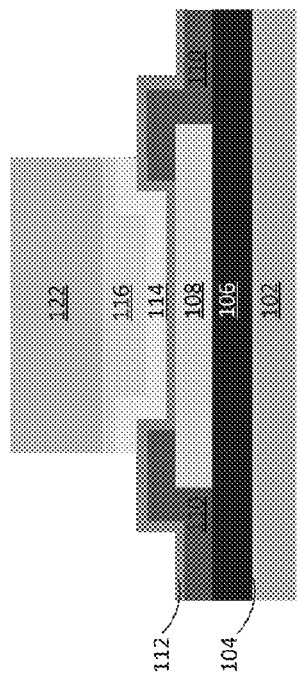
Fig. 3A
Fig. 3B
Fig. 3C

SOLDER BUMP FOR BALL GRID ARRAY

This application claims the benefit of U.S. Provisional Application Ser. No. 61/677,891, filed on Jul. 31, 2012, entitled "Solder Bump for Ball Grid Array", which application is hereby incorporated herein by reference.

TECHNICAL FIELD

The present disclosure relates generally to an integrated circuit and more particularly a solder bump for a ball grid array (BGA).

BACKGROUND

Some solder ball structures of a ball grid array (BGA) suffer degradation of electrical connections from solder cracks at connection areas through the solder balls. Further, stand-off height variation among solder balls in an array may degrade electrical connections and reliability.

BRIEF DESCRIPTION OF THE DRAWINGS

Reference is now made to the following descriptions taken in conjunction with the accompanying drawings, in which:

FIGS. 3A-3G are intermediate steps of an exemplary fabrication process of the solder bump structure in FIG. 1 according to some embodiments.

DETAILED DESCRIPTION

Figure 1:
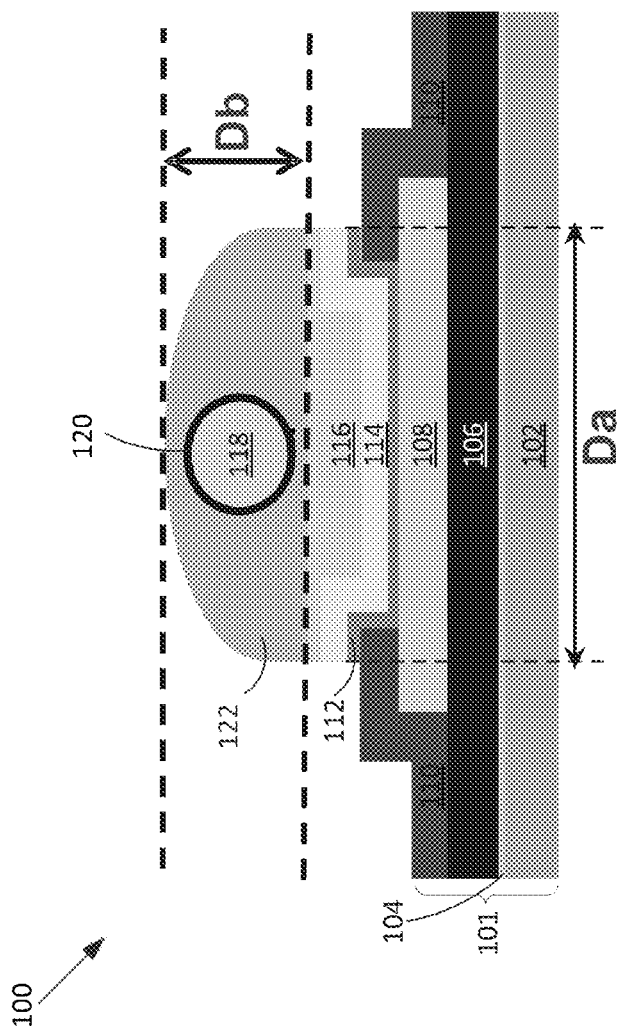
FIG. 1 is a cross-section of an exemplary solder bump structure for a ball grid array (BGA) according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a cross-section of an exemplary solder bump structure 100 for a ball grid array (BGA) according to some embodiments. In the solder bump structure 100, a substrate 101 includes a glass substrate 102 and a silicon substrate 106 bonded together by a glue layer 104. In other embodiments, the substrate 101 can comprise silicon, silicon dioxide, aluminum oxide, sapphire, germanium, gallium arsenide (GaAs), an alloy of silicon and germanium, indium phosphide (InP), or any other suitable material. Also, the substrate 101 can have one substrate layer instead of multiple substrate layers as shown in FIG. 1.

A redistribution layer (RDL) 108 is an electrically conductive layer, used for electrical connections. For example, the redistribution layer 108 connects with input/output (IO) pads in other locations. In some embodiments, the redistribution layer 108 comprises metal such as copper, aluminum, or any other suitable material. A passivation layer 110 comprises oxide or nitride in some embodiments and reduces chemical and/or electrical reactivity of the surface.

The solder bump structure 100 includes under bump metal (UBM) layers 112 and 114. The first layer 112 of the UBM layers comprises Ti, W, Cr, TiW, any combination thereof, or any other suitable material in some embodiments. The second layer 114 comprises Cu, Ni, Ni—V alloy, any combination thereof, or any other suitable material. The diameter of UBM layers 112 and 114 ranges from 20 µm to 600 µm in some embodiments. The UBM layers 112 and 114 can be formed, e.g., by sputtering. Even though two UBM layers 112 and 114 are shown in FIG. 1, different number of layers can be used for UBM.

A copper layer 116 is formed over the second (UBM) layer 114. The copper layer 116 has a thickness (height) that ranges from 5 µm to 20 µm in some embodiments. A solder bump 122 is formed over the copper layer 116 and the second (UBM) layer 114. The solder bump 122 has a bump width Da and a bump height Db. The ratio $\alpha=Db/Da$ is in the range $0.05 \leq \alpha < 1$ in some embodiments, thus the shape of the solder bump 122 is relatively flat compared to a spherical solder ball shape. This provides a greater contact area for the solder bump 122, which reduces defective electrical connection of the solder bump 122 and improves reliability.

The bump height Db can be determined from the diameter of the UMB layers 112 and 114 and the desired ratio $\alpha$ depending on applications. The solder bump 122 can comprise any suitable material, and lead-free material is used for the solder bump 122 in some embodiments.

There is one non-metallic core 118 inside the solder bump 122 in FIG. 1 and there can be more than one non-metallic core 118 or no core in other embodiments. The non-metallic core 118 comprises epoxy, polymer, or any other suitable material, and will alternately be referred to herein as a plastic core. In one example, a divinyl benzene cross-linked polymer is used for the plastic core 118. The diameter of the plastic core 118 ranges from 10 µm to 700 µm in some embodiments. A conductive layer 120 surrounds the plastic core 118 in some embodiments. The conductive layer 120 can comprise copper or any other suitable material. The thickness of the conductive layer 120 ranges from 3 µm to 20 µm in some embodiments.

The plastic core 118 provides a stable standoff height for assembly, which helps to avoid the problem of solder bridging. Also, the plastic core 118 could help to disperse stress in the solder bump structure 100 and to avoid or reduce solder cracking. This improves reliability.

Figure 2:
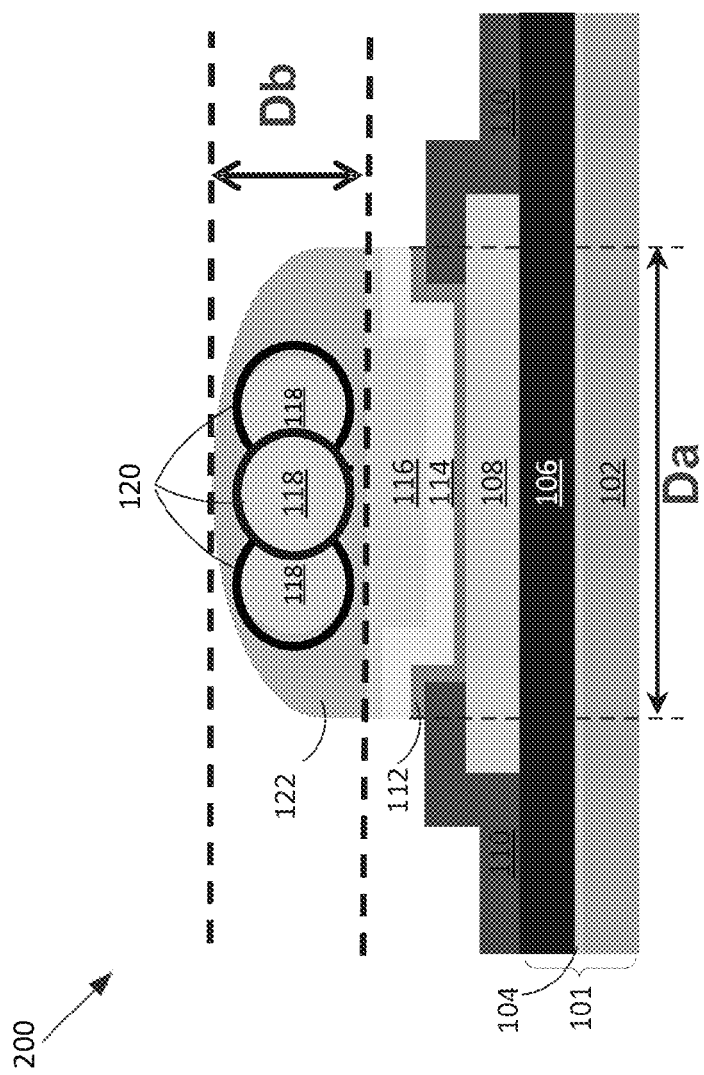
FIG. 2 is a cross-section of another exemplary solder bump structure according to some embodiments.

FIG. 2 is a cross-section of another exemplary solder bump structure 200 according to some embodiments. The solder bump structure 200 is similar to the solder bump structure 100 in FIG. 1 except that there are three plastic cores 118. There can be any other number of plastic cores 118 or no plastic core in other embodiments.

Figure 3D:
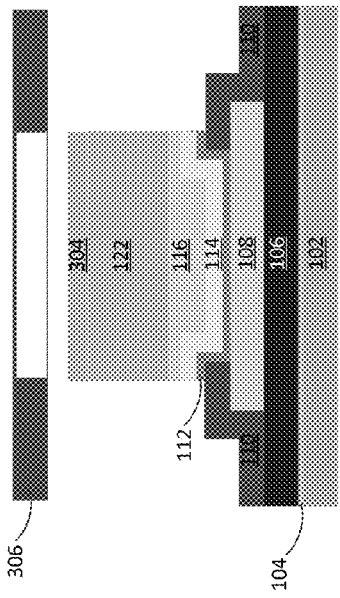

FIGS. 3A-3G are intermediate steps of an exemplary fabrication process of the solder bump structure in FIG. 1 according to some embodiments. In FIG. 3A, a photoresist layer 302, e.g., a dry film resist (DFR), is deposited over the UBM layers 112 and 114, and partially removed by photolithography to expose the second UBM layer 114. The first (UBM) layer 112 comprises Ti, W, Cr, TiW, any combination thereof, or any other suitable material in some embodiments. The second (UBM) layer 114 comprises Cu, Ni, Ni—V alloy, any combination thereof, or any other suitable material.

In FIG. 3B, bump plating is performed to deposit the copper layer 116 and the solder bump 122. The copper layer 116 has a thickness (height) that ranges from 5 μm to 20 μm in some embodiments. The solder bump 122 has a bump width Da and a bump height Db as shown in FIG. 1. The ratio $\alpha=Db/Da$ is in the range $0.05 \leq \alpha < 1$ in some embodiments, thus the shape of the solder bump 122 is relatively flat compared to a spherical solder ball shape. This provides a greater contact area for the solder bump 122, which reduces defective electrical connection of the solder bump 122 and improves reliability.

The bump height Db can be determined from the diameter of the second (UMB) layer 114 and the ratio $\alpha$ in some embodiments. The solder bump 122 can comprise any suitable material, and lead-free material is used for the solder bump 122 in some embodiments. The solder bump 122 can be formed, e.g., by electroplating over the copper layer 116. The solder bump 122 comprises tin as a principal element in some embodiments.

In FIG. 3C, the photoresist layer 302 is stripped (removed) after the bump plating described above.

In FIG. 3D, the (first) UBM layer 112 is etched using the solder bump 122 as a mask.

Figure 3E:
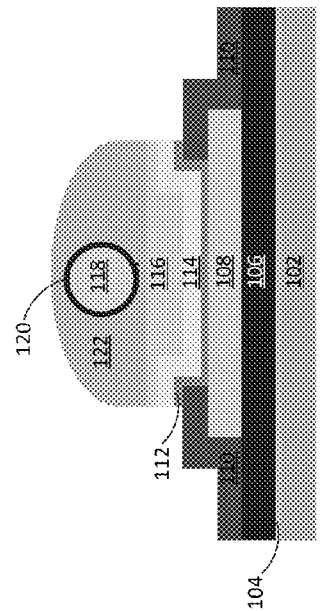

In FIG. 3E, flux material 304 is printed over the solder bump 122 using a stencil 306. The opening size of the stencil 306 is about 90% of the diameter of UBM layers 112 and 114 in some embodiments.

Figure 3F:
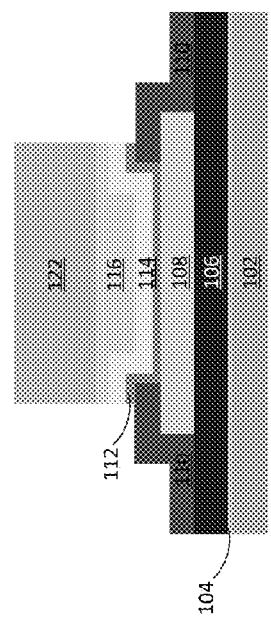

In FIG. 3F, the plastic core 118 having the surrounding conductive layer 120 is mounted (i.e., ball mounting) using a stencil 308. The plastic core 118 can comprise epoxy, polymer, or any other suitable material. In one example, divinyl benzene cross-linked polymer is used for the plastic core 118. The conductive layer 120 comprises copper or any other suitable material in some embodiments. The plastic core 118 provides stable standoff height for assembly, which helps to avoid solder bridging. Also, the plastic core 118 could help stress dispersion in the solder bump structure 100 and avoid solder cracking, which improves reliability. The opening size of the stencil 308 is about 120% of the total diameter of the plastic core 118 with the conductive layer 120 in some embodiments.

Figure 3G:
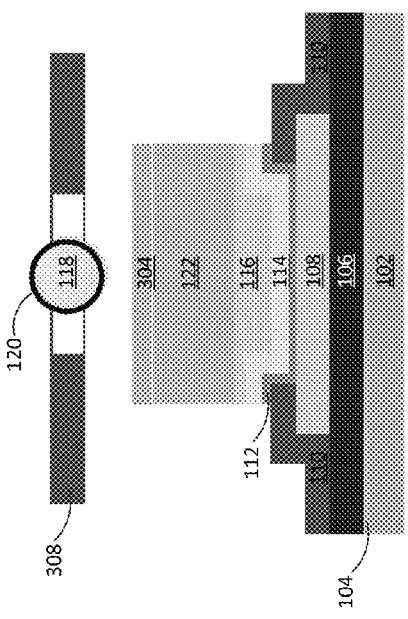

In FIG. 3G, the solder bump 122 is reflowed and the plastic core 118 is positioned inside the solder bump 122. In some embodiments, the reflow is performed at peak temperature ranging from 230° C. to 270° C., depending on the solder bump 122 material. Afterwards, the flux material 304 is cleaned, e.g., using water.

According to some embodiments, a solder bump structure for ball grid array (BGA) includes at least one under bump metal (UBM) layer and a solder bump formed over the at least one UBM layer. The solder bump has a bump width and a bump height and the ratio of the bump height over the bump width is less than 1.

According to some embodiments, a method of forming a solder bump structure for a ball grid array (BGA) includes forming at least one under bump metal (UBM) layer over a substrate. A solder bump is formed over the at least one UBM layer. The solder bump has a bump width and a bump height. The ratio of the bump height over the bump width is less than 1.

According to some embodiments, an integrated circuit includes a substrate, at least one under bump metal (UBM) layer formed over the substrate, and a lead-free solder bump formed over the at least one UBM layer. The solder bump has at least one plastic core inside. The solder bump has a bump width and a bump height, and a ratio of the bump height over the bump width is less than 1.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of forming a solder bump structure for a ball grid array (BGA), comprising:
   forming at least one under bump metal (UBM) layer over a substrate;
   forming a solder bump over the at least one UBM layer, wherein the solder bump has a bump width and a bump height and a ratio of the bump height over the bump width is less than 1; and
   forming at least one non-metallic core inside the solder bump, wherein forming the at least one non-metallic core comprises:
   placing the non-metallic core atop the solder bump; and
   reflowing the solder bump.

2. The method of claim 1, wherein a conductive layer surrounds the at least one non-metallic core, and wherein the solder bump surrounds the conductive layer.

3. The method of claim 1, wherein the at least one non-metallic core comprises epoxy.

4. The method of claim 1, further comprising forming a copper layer between the at least one UBM layer and the solder bump.

5. The method of claim 1, wherein the at least one UBM layer comprises a first layer and a second layer.

6. The method of claim 5, wherein the first layer comprises Ti, W, Cr, TiW, or any combination thereof.

7. The method of claim 5, wherein the second layer comprises Cu, Ni, Ni—V alloy, or any combination thereof.

8. A method of forming a solder bump structure for a ball grid array (BGA), comprising:
   forming at least one under bump metal (UBM) layer over a substrate;
   forming a solder bump over the at least one UBM layer;
   mounting at least one non-metallic core on the solder bump using a stencil; and reflowing the solder bump, wherein, after the reflowing, the at least one non-metallic core is positioned inside the solder bump.

9. The method of claim 8, further comprising forming a copper layer between the at least one UBM layer and the solder bump.

10. The method of claim 8, wherein the at least one non-metallic core comprises at least three non-metallic cores.

11. The method of claim 8, further comprising forming a conductive layer around the at least one non-metallic core before mounting the at least one non-metallic core on the solder bump.

12. The method of claim 8, wherein the solder bump has a bump width and a bump height, and wherein a ratio of the bump height over the bump width is between 0.05 and 1.

13. The method of claim 1, wherein the at least one non-metallic core comprises at least two non-metallic cores.

14. The method of claim 1, wherein reflowing the solder bump is performed at a peak temperature ranging from about 230° C. to about 270° C.

15. The method of claim 2, wherein the conductive layer comprises copper.

16. The method of claim 2, wherein a diameter of the non-metallic core ranges from about 10 μm to about 700 μm, and wherein a thickness of the conductive layer ranges from about 3 μm to about 20 μm.

17. The method of claim 11, wherein an opening size of the stencil is about 120% of a total diameter of the conductive layer and the at least one non-metallic core.

18. The method of claim 11, wherein the conductive layer comprises copper.

19. The method of claim 8, wherein reflowing the solder bump is performed at a peak temperature ranging from about 230° C. to about 270° C.

20. A method of forming a solder bump structure for a ball grid array (BGA), comprising:
    forming a first under bump metal (UBM) layer over a substrate;
    forming a second UBM layer over the first UBM layer;
    depositing a copper layer over the second UBM layer;
    forming a solder bump over the second UBM layer;
    etching the first UBM layer using the solder bump as a mask;
    mounting a non-metallic core on the solder bump; and
    reflowing the solder bump, wherein, after the reflowing, the non-metallic core is positioned inside the solder bump.

* * * * *